(12) United States Patent
Choi et al.

(10) Patent No.: US 10,583,586 B2
(45) Date of Patent: Mar. 10, 2020

(54) IMPRINT MOLD AND MANUFACTURING METHOD OF THE SAME

(71) Applicant: LG Display Co., Ltd., Seoul (KR)

(72) Inventors: Sung-Woo Choi, Seoul (KR); Chul-Ho Kim, Paju-si (KR); Yun-Ho Kook, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 63 days.

(21) Appl. No.: 15/793,784

(22) Filed: Oct. 25, 2017

(65) Prior Publication Data

US 2018/0111291 A1    Apr. 26, 2018

(30) Foreign Application Priority Data

Oct. 25, 2016   (KR) .................. 10-2016-0139358

(51) Int. Cl.
*B29C 33/42* (2006.01)
*B29C 33/38* (2006.01)
*G03F 7/00* (2006.01)
*B29C 33/02* (2006.01)

(52) U.S. Cl.
CPC ........ *B29C 33/424* (2013.01); *B29C 33/3842* (2013.01); *G03F 7/0002* (2013.01); *B29C 2033/023* (2013.01)

(58) Field of Classification Search
CPC .............. B29C 33/424; B29C 33/3842; B29C 2033/023; G03F 7/0002
See application file for complete search history.

(56) References Cited

U.S. PATENT DOCUMENTS

| | | | | |
|---|---|---|---|---|
| 2003/0205657 | A1* | 11/2003 | Voisin | B82Y 10/00 249/187.1 |
| 2004/0023126 | A1* | 2/2004 | Mancini | B82Y 10/00 430/5 |
| 2005/0202350 | A1 | 9/2005 | Colburn et al. | |
| 2008/0182070 | A1 | 7/2008 | Chou et al. | |
| 2011/0058150 | A1* | 3/2011 | Schaper | G03B 27/42 355/53 |
| 2015/0283743 | A1* | 10/2015 | Park | B29C 33/3842 216/41 |

FOREIGN PATENT DOCUMENTS

| | | | | |
|---|---|---|---|---|
| WO | 2007/030527 A2 | 3/2007 | | |
| WO | WO-2009046954 A2 * | 4/2009 | ........... | B81C 99/009 |

OTHER PUBLICATIONS

[NPL-1] Hillmer (WO 2009/046954 A2); Apr. 16, 2009 (EPO—machine translation to English). (Year: 2009).*
Mata, A. et al., "Fabrication of multi-layer SU-8 microstructures," *Journal of Micromechanics and Microengineering*, 16 (2006) 276-284 (10 pgs).
Lausecker, E. et al., "Self-aligned imprint lithography for top-gate amorphous silicon thin-film transistor fabrication," *Applied Physics Letters* 96, 263501 (2010) doi:10.1063/1.3457446 (4 pgs).
Choi et al., "Scalable fabrication of flexible multi-level nanoimprinting molds with uniform heights via a 'top-to-bottom' level patterning sequence," Applied Surface Science 428:895-899, 2018.

* cited by examiner

*Primary Examiner* — David Sample
*Assistant Examiner* — Donald M Flores, Jr.
(74) *Attorney, Agent, or Firm* — Seed IP Law Group LLP

(57) ABSTRACT

An imprint mold includes a substrate; a pattern on the substrate and having a multi-layered structure; and an etch stop layer between an upper layer and a lower layer of the pattern.

14 Claims, 4 Drawing Sheets

IMPRINT MOLD AND MANUFACTURING METHOD OF THE SAME

CROSS-REFERENCE TO RELATED APPLICATION

The present application claims priority under U.S.C. § 119(a) to Korean Patent Application No. 10-2016-0139358 filed on Oct. 25, 2016, which is hereby incorporated by reference in its entirety.

BACKGROUND

Technical Field

The present disclosure relates to an imprint mold having multi-layered patterns and a manufacturing method of the same.

Description of the Related Art

Liquid crystal display devices among various flat panel display devices have been widely used for display devices such as notebook computers, televisions, tablet computers, monitors, smartphones, potable display instruments and portable information instruments because of their thin thicknesses, light weights, lower power consumption.

A liquid crystal display device includes a plurality of thin films, each of which is formed through a mask process including deposition, light-exposing, developing and etching steps. The mask process increases manufacturing costs because it is very complicated. Therefore, an imprint patterning process using an imprint mold has been researched to form the plurality of thin films of the liquid crystal display device.

In the imprint patterning process, thin film patterns are formed by contacting an imprint mold with a resin layer coated on a substrate of the liquid crystal display device. Here, the imprint mold has a plurality of patterns opposite to the thin film patterns to be formed on the substrate, and the patterns are reversed and transferred to the resin layer, thereby forming the thin film patterns.

The patterns of the imprint mold are formed through a mask process including light-exposing, developing and etching steps. For example, the patterns may be formed by patterning a resin layer coated on a substrate for an imprint mold through the mask process.

However, in the imprint mold, there occur variations in heights and inclination angles of the patterns due to deviation of the mask process and a size of the pattern. As a result, defects of the thin film patterns occur in the imprint patterning process of the liquid crystal device using the imprint mold. The defects become worse when the patterns of the imprint mold each have a multi-layered structure.

BRIEF SUMMARY

Accordingly, the present disclosure is directed to an imprint mold and a manufacturing method of the same that substantially obviate one or more of the problems due to limitations and disadvantages of the related art.

An object of the present disclosure is to provide an imprint mold and a manufacturing method of the same capable of improving uniformity in heights and inclination angles of patterns with a multi-layered structure.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, there is provided an imprint mold that includes a substrate; a pattern on the substrate and having a multi-layered structure; and an etch stop layer between an upper layer and a lower layer of the pattern.

In another aspect, a manufacturing method of an imprint mold includes sequentially forming a buffer layer, a first resin pattern layer, an etch stop pattern layer, and a second resin pattern layer on a substrate; forming an upper layer of a pattern by selectively etching the second resin pattern layer; forming an etch stop layer under the upper layer by selectively etching the etch stop pattern layer; and forming a lower layer of the pattern under the etch stop layer by selectively etching the first resin pattern layer.

It is to be understood that both the foregoing general description and the following detailed description are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and which are incorporated in and constitute a part of this specification, illustrate embodiments of the disclosure and together with the description serve to explain the principles of the disclosure. In the drawings.

DETAILED DESCRIPTION

Reference will now be made in detail to embodiments of the disclosure, examples of which are illustrated in the accompanying drawings.

Figure 1:
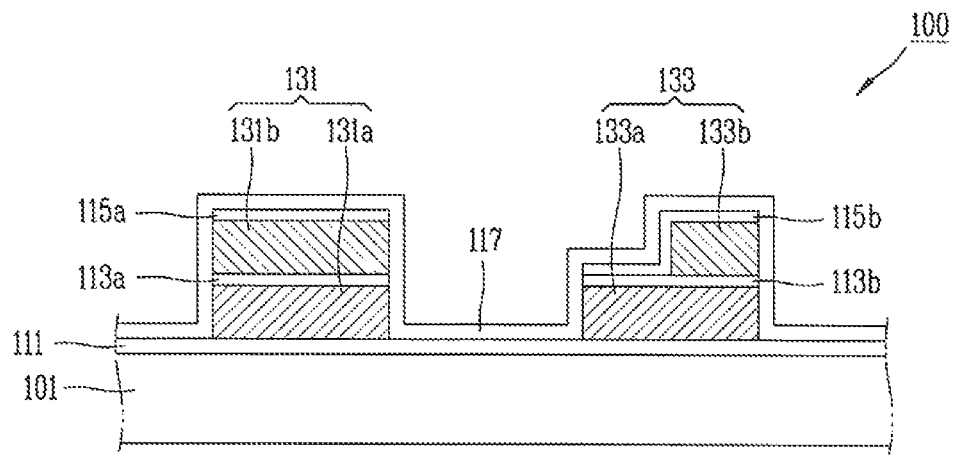
FIG. 1 is a schematic view of an imprint mold according to an embodiment of the present disclosure.

FIG. 1 is a schematic view of an imprint mold according to an embodiment of the present disclosure.

In FIG. 1, the imprint mold 100 according to the embodiment of the present disclosure includes at least one pattern having a multi-layered structure formed on a substrate 101. For example, the imprint mold 100 may include a first pattern 131 and a second pattern 133.

The first pattern 131 may include a first-first pattern 131a as a lower layer and a first-second pattern 131b as an upper layer. The first-first pattern 131a and the first-second pattern 131b of the first pattern 131 may have the same size. The first-first pattern 131a and the first-second pattern 131b of the first pattern 131 may also have the same height and inclination angle.

The second pattern 133 may include a second-first pattern 133a as a lower layer and a second-second pattern 133b as an upper layer. The second-first pattern 133a and the second-second pattern 133b of the second pattern 133 may have different sizes, and thus, the second pattern 133 may have multiple steps, that is, a multi-stage structure. Here, the second-second pattern 133b may have a smaller size than the second-first pattern 133a. The second-first pattern 133a and the second-second pattern 133b of the first pattern 133 may also have the same height and inclined angle.

An etch stop layer 113a may be disposed between the first-first pattern 131a and the first-second pattern 131b of the first pattern 131. In addition, an etch stop layer 113b may be disposed between the second-first pattern 133a and the second-second pattern 133b of the second pattern 133. The etch stop layers 113a and 113b may prevent a pattern layer (not shown) for forming the lower layers, i.e., the first-first pattern 131a and the second-first pattern 133a from being etched in respective processes of forming the upper layers of the first pattern 131 and the second pattern 133. The etch stop layers 113a and 113b may have sizes corresponding to respective top surfaces of the lower layers of the first pattern 131 and the second pattern 133.

Moreover, a buffer layer 111 may be disposed all over the substrate 101, and the lower layers of the first pattern 131 and the second pattern 133, that is, the first-first pattern 131a and the second-first pattern 133a may be positioned on the buffer layer 111. The buffer layer 111 may increase adhesion between the substrate 101 and the first-first pattern 131a and adhesion between the substrate 101 and the second-first pattern 133a.

Furthermore, at least one passivation layer may be disposed over the first pattern 131 and the second pattern 133. For example, first passivation layers 115a and 115b and a second passivation layer 117 may be disposed over the first pattern 131 and the second pattern 133.

The first passivation layers 115a and 115b may be positioned on the first pattern 131 and the second pattern 133, respectively. The second passivation layer 117 may be formed all over the substrate 101 including the first pattern 131 and the second pattern 133. The first passivation layers 115a and 115b and the second passivation layer 117 may protect the first pattern 131 and the second pattern 133 from be damaged.

Here, on the first pattern 131 and the second pattern 133, more specifically, on the first-second pattern 131b of the first pattern 131 and the second-second pattern 133b of the second pattern 133, the first passivation layers 115a and 115b and the second passivation layer 117 may are sequentially layered to constitute a double-layered structure.

FIGS. 2A to 2G are views of illustrating respective steps in a manufacturing process of an imprint mold according to the embodiment of the present disclosure.

Figure 2A:
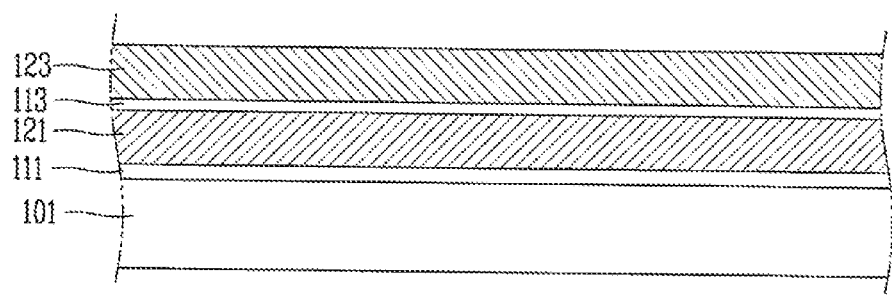
FIGS. 2A to 2G are views of illustrating respective steps in a manufacturing process of an imprint mold according to the embodiment of the present disclosure.

In FIG. 2A, a buffer layer 111, a first resin pattern layer 121, an etch stop pattern layer 113 and a second resin pattern layer 123 may be sequentially formed all over a substrate 101 for an imprint mold.

The substrate 101 may be an insulating substrate such as a glass substrate or may be a flexible substrate such as a plastic film.

The buffer layer 111 may be deposited all over the substrate 101. The buffer layer 111 may be formed of a conductive material such as indium tin oxide (ITO) and indium zinc oxide (IZO) or an inorganic material such as silicon oxide ($SiO_2$) and silicon nitride (SiNx). Alternatively, the buffer layer 111 may be formed of a metallic material such as molybdenum (Mo), titanium (Ti) or molybdenum/titanium (MoTi). The buffer layer 111 may increase the adhesion between the first resin pattern layer 121 and the substrate 101 and may have a thickness of 500 to 1000 Å.

The first resin pattern layer 121 may be coated all over the buffer layer 111. The first resin pattern layer 121 is used to form the lower layers of the first pattern 131 and the second pattern 133 of FIG. 1. The first resin pattern layer 121 may be an organic material such as photo-curable acrylate or the like.

The etch stop pattern layer 113 may be deposited all over the first resin pattern layer 121. The etch stop pattern layer 113 may be an etch stopper for protecting the first resin pattern layer 121 during a step of etching each of the upper layers of the first pattern 131 and the second pattern 133. The etch stop pattern layer 113 may be formed of a material such as ITO or IZO. The etch stop pattern layer 113 may have a thickness of 500 to 1000 Å.

The second resin pattern layer 123 may be coated all over the etch stop pattern layer 113. The second resin pattern layer 123 is used to form the upper layers of the first pattern 131 and the second pattern 133 of FIG. 1. The second resin pattern layer 123 may be an organic material such as photo-curable acrylate or the like.

Figure 2B:
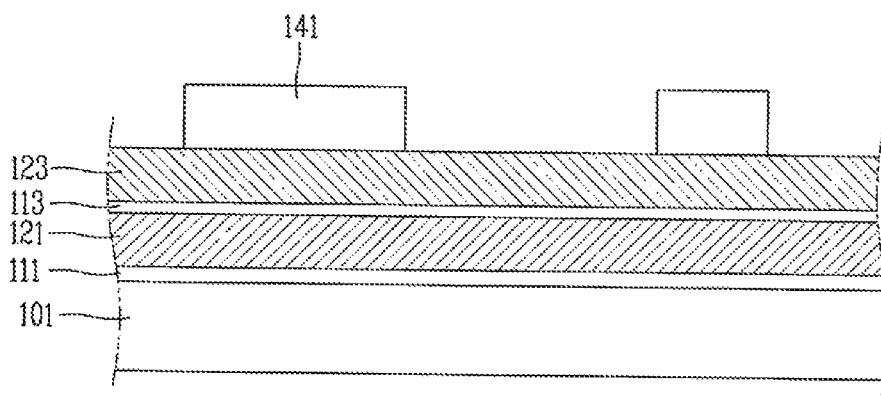
Figure 2C:
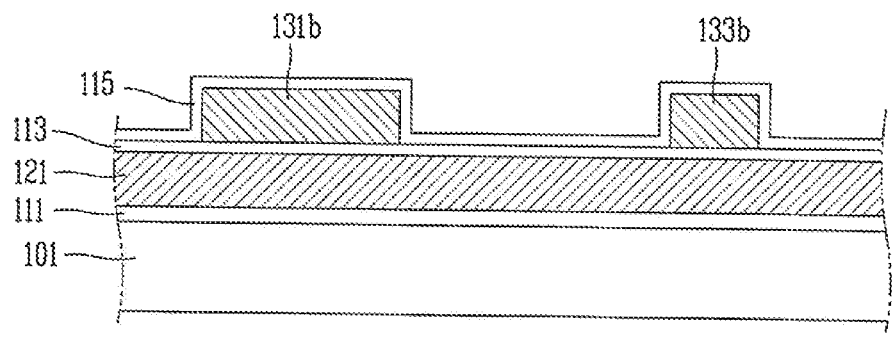

Referring to FIGS. 2B and 2C, first photo resist patterns 141 may be formed by applying photoresist (not shown) all over the second resin pattern layer 123 and selectively patterning it.

Then, the second resin pattern layer 123 may be selectively etched by using the first photoresist patterns 141 as an etching mask, thereby forming the upper layers of the first pattern 131 and the second pattern 133, that is, the first-second pattern 131b and the second-second pattern 133b. Here, the second resin pattern layer 123 may be dry-etched. At this time, since the etch stop pattern layer 113 is positioned between the first resin pattern layer 121 and the second resin pattern layer 123, only the second resin pattern layer 123 may be etched in the above-mentioned etching step.

Subsequently, the first photoresist patterns 141 remaining on the substrate 101 may be removed through an ashing process, and a first passivation pattern layer 115 may be deposited all over the substrate 101 including the first-second pattern 131b and the second-second pattern 133b. The first passivation pattern layer 115 may be formed of ITO or IZO and may have a thickness of 100 to 500 Å.

Figure 2D:
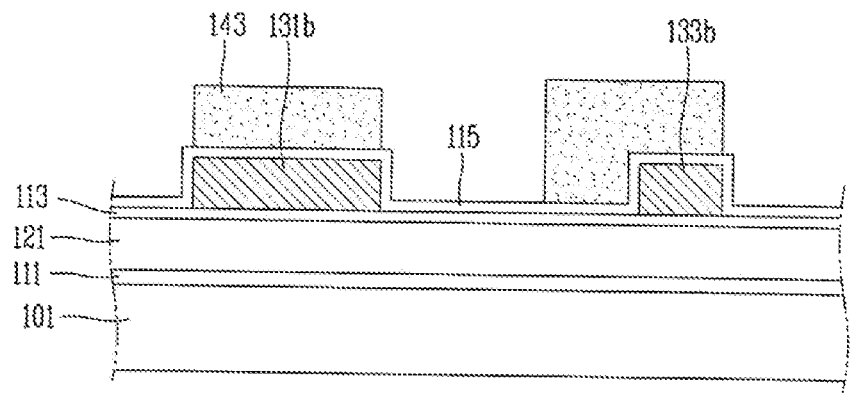

Next, in FIG. 2D, second photoresist patterns 143 may be formed by applying photoresist (not shown) all over the first passivation pattern layer 115 and selectively patterning it.

Figure 2E:
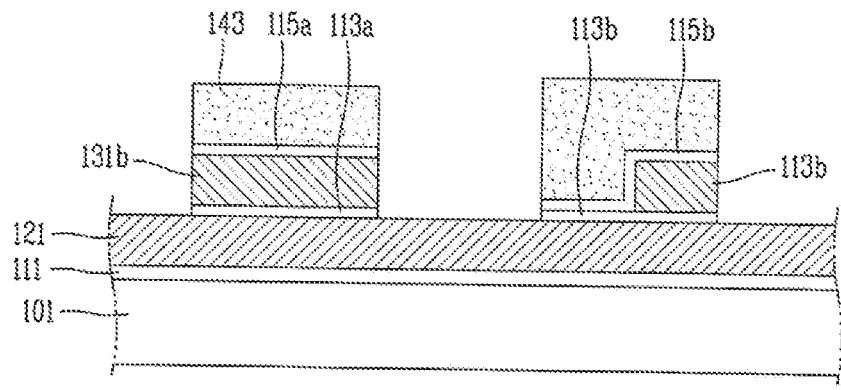
Figure 2F:
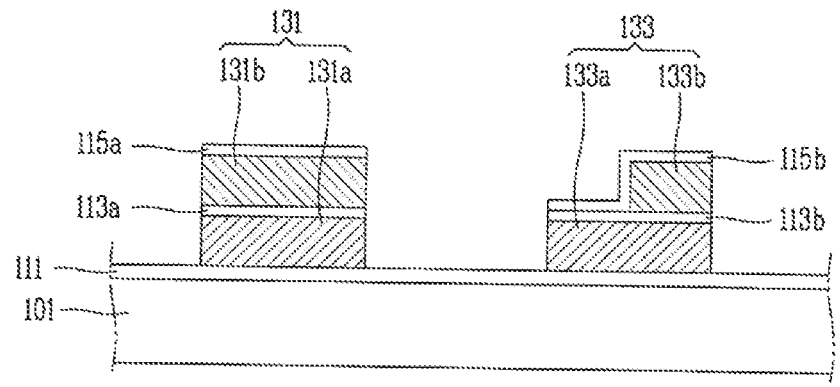

Then, referring to FIGS. 2E and 2F, the first passivation pattern layer 115 and the etch stop pattern layer 113 may be selectively etched in order by using the second photoresist patterns 143 as an etching mask, thereby forming the first passivation layers 115a and 115b and the etch stop layers 113a and 113b. The first passivation pattern layer 115 and the etch stop pattern layer 113 may be wet-etched.

Since the second photoresist patterns 143 are used for the above-mentioned etching step, the first passivation pattern layer 115 and the etch stop pattern layer 113 may be etched in all regions except a region overlapping the second photoresist patterns 143. Therefore, the first passivation layer 115b on the second-second pattern 133b and the etch stop layer 113b under the second-second pattern 133b have a larger area than the second-second pattern 133b. Namely, the etch stop layers 113a and 113b may have sizes corresponding to upper surfaces of the lower layers of the first pattern 131 and the second pattern 133, respectively.

Subsequently, the first resin pattern layer 121 may be selectively etched by using the second photoresist patterns 143 as an etching mask, thereby forming the lower layers of the first pattern 131 and the second pattern 133, that is, the first-first pattern 131a and the second-first pattern 133a. The first resin pattern layer 121 may be dry-etched.

Figure 2G:
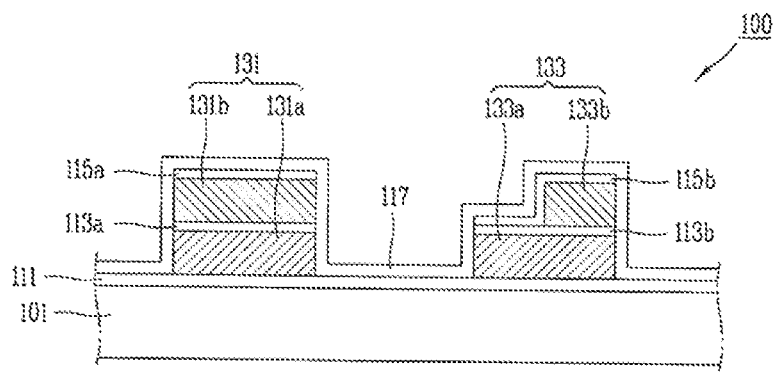

Then, in FIG. 2G, the second passivation layer 117 may be formed by depositing a second passivation pattern layer all over the substrate 101 on which the first pattern 131 and the second pattern 133 are formed. The second passivation layer 117 may be formed of ITO or IZO and may have a thickness of 100 to 500 Å.

The imprint mold 100 including the first pattern 131 and the second pattern 133 of the multiple-layered structure may be formed on the substrate 101 through the above-mentioned processes. Here, the second pattern 133 may have the multi-stage structure in which the upper layer has a smaller area than the lower layer, i.e., the second-second pattern 133b has a smaller layer than the second-first pattern 133a.

As stated above, in the imprint mold 100 according to the embodiment of the present disclosure, the etch stop layer 113a is disposed between the upper layer and the lower layer of the first pattern 131, and the etch stop layer 113b is disposed between the upper layer and the lower layer of the second pattern 133. The etch stop layers 113a and 11b prevent the layers of the patterns formed on the substrate 101 from being damaged during the etching steps. Accordingly, it is possible to improve uniformity in heights and inclination angles of the patterns with a multi-layered structure of the imprint mold 100. For example, in the imprint mold 100, the height and the inclination angle between the first-first pattern 131a and the first-second pattern 131b of the first pattern 131 may be substantially equal to the height and the inclination angle between the second-first pattern 133a and the second-second pattern 133b of the second pattern 133 within an error range due to the etch stop layers 113a and 113b.

Meanwhile, in the etching step of the first passivation pattern layer 115 and the etch stop pattern layer 113, the first passivation layers 115a and 115b are formed on the first-second pattern 131b and the second-second pattern 133b. Thus, a double layer of the first passivation layer 115a and the second passivation layer 117 may be formed on the first pattern 131, and a double layer of the first passivation layer 115b and the second passivation layer 117 may be formed on the second pattern 133.

Figure 3A:
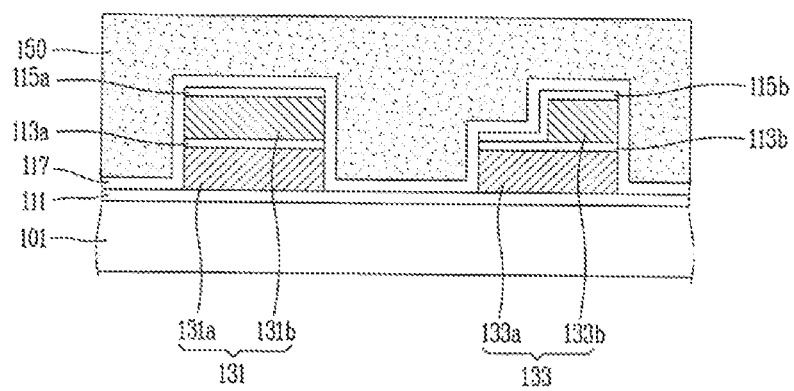
FIGS. 3A and 3B are views of illustrating respective steps in a manufacturing process of a sub mold using an imprint mold of the present disclosure.
Figure 3B:
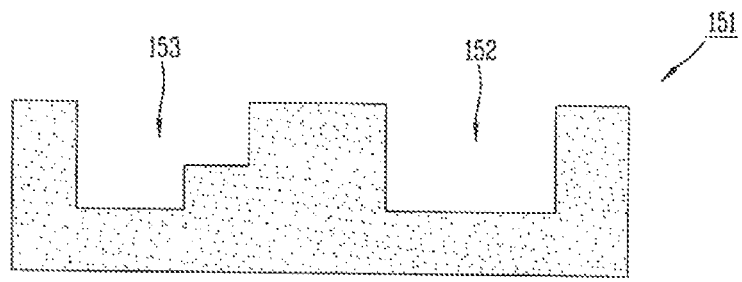

FIGS. 3A and 3B are views of illustrating respective steps in a manufacturing process of a sub mold using an imprint mold of the present disclosure.

The imprint mold of the present disclosure, which is explained with reference to FIG. 1 and FIGS. 2A to 2G, is an imprint master mold. The imprint master mold includes multi-stage patterns substantially the same as thin film patterns to be formed in the display device. Accordingly, a mold having multi-stage patterns opposite to the thin film patterns of the display device is needed in order to perform an imprint patterning process to the display device. Hereinafter, an imprint sub mold used in the imprint patterning process of the display device will be described.

Referring to FIG. 3A, a polymer material 150 having a rubber property may be applied to the imprint mold 100 of FIG. 1 according to the present disclosure and may be thermally cured or photo-cured. The polymer material 150 may be formed of polydimethylsiloxane (PDMS) or the like.

According to this, the first pattern 131 and the second pattern 133 of the imprint mold 100 may be reversed and transferred to the polymer material 150, and thus imprint sub mold 151 may be formed as shown in FIG. 3B.

The imprint sub mold 151 may include a first dented portion 152 and a second dented portion 153. The first dented portion 152 may correspond to the first pattern 131 of the imprint mold 100, and the second dented portion 153 may correspond to the second pattern 133.

The imprint sub mold 151 may form mask patterns with multiple steps for patterning the thin film patterns of an array substrate of various display devices, for example, a liquid crystal display device, an electrophoretic display device, an organic light-emitting display device or the like.

Figure 4:
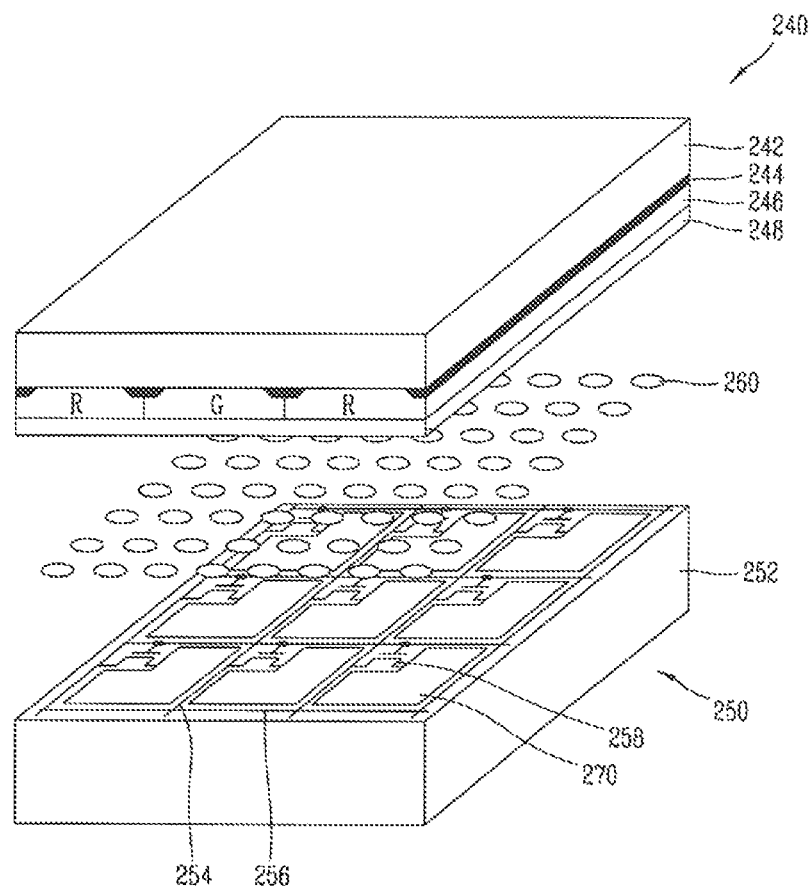
FIG. 4 is a view of a liquid crystal panel having patterns formed through an imprint patterning process using an imprint mold according to the present disclosure.

For instance, the imprint sub mold 151 may be used for a manufacturing process of a liquid crystal panel shown in FIG. 4. Specifically, the liquid crystal panel may include an array substrate 250 and a color filter substrate 240 attached to each other with a liquid crystal layer 260 interposed therebetween.

The array substrate 250 may include gate lines 256 and data lines 254 formed on an insulating substrate 252 and crossing each other. The array substrate 250 may further include a thin film transistor 258 at each crossing portion of the gate and data lines 256 and 254 and a pixel electrode 270 connected to the thin film transistor 258.

The color filter substrate 240 may include color filters 246 formed on an insulating substrate 242, a black matrix 244 for partitioning the color filters 246, and a common electrode 248 forming an electric field with the pixel electrode 270 of the array substrate 250. The common electrode 248 may be formed on the array substrate 250.

In the liquid crystal panel, the thin film transistors 258, the gate lines 256, the data lines 254, and the pixel electrode 270 of the array substrate 250 may be formed through an imprint patterning process using the imprint sub mold 151. Additionally, in the liquid crystal panel, the color filters 246 and the black matrix 244 of the color filter substrate 240 may be formed through an imprint patterning process using the imprint sub mold 151.

Here, since the imprint sub mold 151 is formed from the imprint mold 100 including the patterns of the multi-layered structure, which have improved uniformity in the height and the inclination angle of each layer, the uniformity in the heights and the inclination angles of the plurality of patterns of the liquid crystal panel, which are formed in the imprint patterning process using the imprint sub mold 151, can be improved. Therefore, the defects of the thin film patterns can be prevented from being generated in the imprint patterning process.

In the meantime, the imprint mold 100 and the imprint sub mold 151 according to the present disclosure are applied to the manufacturing process of the liquid crystal panel, and the present disclosure is not limited thereto. For example, the imprint mold 100 and the imprint sub mold 151 according to the present disclosure may be applied to a manufacturing process of an array substrate of an organic light emitting display device or may be applied to a manufacturing process of touch electrodes and touch lines of a touch display device.

The imprint mold according to the present disclosure can prevent damages in the etching process for each layer of the patterns by forming the etch stop layer between the upper layer and the lower layer of the pattern with the multi-layered structure.

Accordingly, the imprint mold can improve the height uniformity and the inclination angle uniformity of the upper and lower layers of each pattern and can prevent occurrence of the defects in the manufacturing process of the plurality of patterns of the display device using the imprint mold.

It will be apparent to those skilled in the art that various modifications and variations can be made in a display device of the present disclosure without departing from the sprit or scope of the embodiments. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An imprint mold comprising:
   a substrate of the imprint mold;
   a pattern structure on the substrate, the pattern structure having a multi-layered structure;
   an etch stop layer between an upper layer and a lower layer of the pattern structure; and
   a first passivation layer on the upper layer of the pattern structure.

2. The imprint mold of claim 1, wherein the pattern structure has a multi-stage structure in which the upper layer has a smaller size than the lower layer, and the etch stop layer has a size corresponding to an upper surface of the lower layer.

3. The imprint mold of claim 1, further comprising a buffer layer between the substrate and the lower layer.

4. The imprint mold of claim 1, further comprising a second passivation layer on the substrate.

5. The imprint mold of claim 4, wherein the first passivation layer and the second passivation layer are sequentially layered on the upper layer of the pattern structure and constitute a double-layered structure.

6. The imprint mold of claim 1 wherein the substrate is a plastic.

7. The imprint mold of claim 6 wherein the upper layer is composed of a resin.

8. The imprint mold of claim 6 wherein the lower layer is composed of a resin.

9. The imprint mold of claim 1 wherein the substrate is a glass.

10. The imprint mold of claim 1 wherein the etch stop layer is composed of a metal.

11. An imprint mold comprising:
    a substrate;
    at least one pattern structure on the substrate, the pattern structure having a plurality of layers;
    at least one etch stop layer between the layers of the pattern structure, the etch stop layer being made of non-doped material;
    a first passivation layer on a topmost layer of the pattern structure; and
    a second passivation layer on the substrate.

12. The imprint mold of claim 11, wherein the etch stop layer is made of material selected from the group consisting of a Indium Tin Oxide and a Indium Zinc Oxide.

13. The imprint mold of claim 11, wherein the layer of the pattern structure includes at least a layer made of a resin.

14. The imprint mold of claim 11, wherein the second passivation layer is extended over the topmost layer of the pattern structure, thereby the first and second passivation layers are sequentially stacked on the topmost layer of the pattern structure.

* * * * *